United States Patent
Yu et al.

(10) Patent No.: US 11,293,953 B2
(45) Date of Patent: Apr. 5, 2022

(54) SYSTEM AND METHOD FOR DIAGNOSING ABNORMALITY IN MAIN CONTROL UNIT

(71) Applicant: LG Chem, Ltd., Seoul (KR)

(72) Inventors: Donghyeon Yu, Daejeon (KR); Tae Youn Kim, Daejeon (KR); Lyang Wook Jo, Daejeon (KR); Seunghyun Lee, Daejeon (KR)

(73) Assignee: LG Energy Solution, Ltd.

( * ) Notice: Subject to any disclaimer, the term of this patent is extended or adjusted under 35 U.S.C. 154(b) by 167 days.

(21) Appl. No.: 16/744,666

(22) Filed: Jan. 16, 2020

(65) Prior Publication Data

US 2020/0174046 A1 Jun. 4, 2020

Related U.S. Application Data (63) Continuation of application No. PCT/KR2018/015064, filed on Nov. 30, 2018.

(30) Foreign Application Priority Data

Dec. 20, 2017 (KR) ........................ 10-2017-0176203

(51) Int. Cl.
| | | |
|---|---|---|
| *G01R 19/165* | (2006.01) | |
| *G01R 31/28* | (2006.01) | |
| *H01M 10/42* | (2006.01) | |

(52) U.S. Cl.
CPC .......... *G01R 19/165* (2013.01); *G01R 31/28* (2013.01); *H01M 10/42* (2013.01)

(58) Field of Classification Search
CPC ...... G01R 19/165; G01R 31/28; G01R 31/00; G01R 31/2839; G01R 31/2843; G01R 19/16576; G01R 31/007; H01M 10/42; H01M 2010/4271; H01M 2010/4278; Y02E 60/10
USPC ........................................................ 324/512
See application file for complete search history.

(56) References Cited

U.S. PATENT DOCUMENTS

| | | | |
|---|---|---|---|
| 9,104,570 B2 | 8/2015 | Bisht et al. | |
| 9,970,991 B2 * | 5/2018 | Katrak | .................... B60L 58/10 |
| 2009/0319209 A1 | 12/2009 | Lim | |

(Continued)

FOREIGN PATENT DOCUMENTS

| | | |
|---|---|---|
| CN | 102862487 A | 1/2013 |
| CN | 204389960 U | 6/2015 |
| CN | 104816813 A | 8/2015 |

(Continued)

OTHER PUBLICATIONS

European Search Report for Application No. 18890532.7 dated Jul. 6, 2020, 2 pages.

(Continued)

*Primary Examiner* — Farhana A Hoque
(74) *Attorney, Agent, or Firm* — Lerner, David, Littenberg, Krumholz & Mentlik, LLP (57) ABSTRACT

A system and a method of diagnosing abnormality of a main control unit, in which an auxiliary control unit for diagnosing an abnormal operation of a main control unit is additionally included in a battery management system including one or more battery management modules and the main control unit controlling the battery management module, thereby more stably driving the battery management system.

14 Claims, 3 Drawing Sheets

(56) References Cited

U.S. PATENT DOCUMENTS

2014/0124890 A1\* 5/2014 Fernando .......... H01L 23/49562
  257/467
2016/0033581 A1\* 2/2016 Sunaga ................ G01R 31/396
  324/434

FOREIGN PATENT DOCUMENTS

| CN | 106080229 A | 11/2016 |
| JP | 2012210081 A | 10/2012 |
| JP | 5715257 B2 | 5/2015 |
| JP | 20170047789 A | 3/2017 |
| KR | 20030030541 A | 4/2003 |
| KR | 20130084875 A | 7/2013 |
| KR | 101388467 B1 | 4/2014 |
| KR | 20150069899 A | 6/2015 |
| KR | 20150132129 A | 11/2015 |
| KR | 20160073109 A | 6/2016 |
| KR | 20170134187 A | 12/2017 |

OTHER PUBLICATIONS

International Search Report from Application No. PCT/KR2018/015064 dated Mar. 7, 2019, 3 pages.
Chinese Search Report for Application No. 201880045751.1 dated Jun. 17, 2021, pp. 1-3.

\* cited by examiner

SYSTEM AND METHOD FOR DIAGNOSING ABNORMALITY IN MAIN CONTROL UNIT

CROSS-REFERENCE TO RELATED APPLICATIONS

The present application is a continuation, of International Application No. PCT/KR2018/015064 filed Nov. 30, 2018, which claims priority from Korean Patent Application No. 10-2017-0176203 filed Dec. 20, 2017, all of which are incorporated herein by reference.

TECHNICAL FIELD

The present invention relates to a system and a method of diagnosing abnormality of a main control unit, and more particularly, to a system and a method of diagnosing abnormality of a main control unit, in which an auxiliary control unit for diagnosing an abnormal operation of a main control unit is additionally included in a battery management system including one or more battery management modules and the main control unit controlling the battery management module, thereby more stably driving the battery management system.

BACKGROUND ART

As demand for a vehicle is increasing, a vehicle industry is developed, and a vehicle penetration rate is exceeding one per household. With the advancement of the vehicle industry, the vehicle includes electrical parts and provides various functions, such as a convenient device, to customers, as well as simply serves as a means for transportation, and it is expected that production cost of electronic components gradually increases and occupies a large portion from "40% in 10 years to 50% in 20 years" in vehicle production cost. However, a vehicle accident risk recently increases due to an electronic error by a rapid electronization of the vehicle, and actually, an accident caused by an erroneous operation of an electronic component due to a problem of software of the electronic component has sharply increased. In order to solve the problem, efforts have been made to secure functional safety of an electrical and electronic system configuring a vehicle and prevent an accident due to a functional problem of a constituent element of a vehicle.

The newly appearing global technology standard ISO 26262 is the international standard for functional safety lead by the Verband Der Automobiindustrile (VDA) and newly established by the International Organization for Standardization (ISO) on Nov. 15, 2011. ISO 26262 is applied to an electrical component system for a vehicle, so that it is possible to provide a safer electrical component system and improve reliability of a vehicle. More particularly, in the main contents, components related to safety in an electrical component system installed in a vehicle (except for a commercial vehicle) having weight of 3,500 kg or less essentially need to be manufactured in accordance with the standard, but an electrical component, which is not related to safety, does not correspond to the standard. Particularly, the Automotive Safety Integrity Level (ASIL) is one of the four levels specifying the requirements required for an item or an element of ISO 26262, and is a safety means applied for preventing an excessive residual risk. In the ASIL, the highest level of the degree of rigor is indicated with D and the lowest level of the degree of rigor is indicated with A, and the level of the ASIL is determined when a development process starts. A product, which does not satisfy the ASIL level, may not be used, or is recognized as a product having degrading safety, thereby failing to provide reliability to customers.

Recently, as an environmental problem is rising, demand for an electric vehicle, which is an eco-friendly vehicle, is increasing, and an electric vehicle highly dependent on an electrical component system is continuously developed in technology in order to satisfy the ASIL level. Particularly, a battery is the most important constituent element in an electric vehicle, so that an electrical component system related to the battery requires a high level of ASIL. Accordingly, an electrical component system, which determines abnormality of a battery and controls the battery and protects a load when abnormality is generated in the battery, is actively developed.

In the meantime, even though a battery monitoring system included in a battery management system in the related art satisfies the ASIL D, it is difficult for a level of a micro controller unit (MCU) for controlling the battery monitoring system to satisfy the ASIL D, so that two microcontroller units (MCUs) (a main MCU and a safety MCU) are used.

However, in the scheme, the MCU of the ASIL B needs to control the battery monitoring system having the ASIL D, so that there is a problem in that there is a limit in a control operation and a reliability of a system is low.

DISCLOSURE

Technical Problem

The present invention is conceived to solve the foregoing problems, and provides a system and a method of diagnosing abnormality of a main control unit, which provide a main control unit satisfying the Automotive Safety Integrity Level (ASIL), which is capable of controlling a battery monitoring system having a level of the ASIL D, by additionally providing an auxiliary control unit, in addition to the main control unit for controlling the battery monitoring system, and diagnosing abnormality of the main control unit based on signals output from a battery management module and the main control unit.

Technical Solution

An exemplary embodiment of the present invention provides a system for diagnosing an abnormality of one or more main control units, the system including: the one or more main control units configured to control one or more battery management modules, which are connected to one or more batteries, respectively; an auxiliary control unit configured to diagnose the abnormality of the one or more main control units through near field communication; and an interface integrated circuit (IC) configured to perform communication between the one or more main control units, the auxiliary control unit, and the one or more battery management modules, in which when each of the one or more main control units is in a normal state, the auxiliary control unit may be configured to set a preset reference voltage of the one or more main control units to a comparison value of the interface IC, and diagnose an abnormality of the interface IC based on a comparison between the voltage applied to the interface IC and the set comparison value.

In the exemplary embodiment, the auxiliary control unit may be configured to communicate with the one or more main control units by using a universal asynchronous receiver-transmitter (UART) communication scheme.

In the exemplary embodiment, the system may further include: a voltage source configured to output a voltage exceeding each of the preset reference voltage and the set comparison value; and a switch configured to switchably connect and disconnect the voltage source and the interface IC.

In the exemplary embodiment, the auxiliary control unit may be configured to apply the voltage output from the voltage source to the interface IC by controlling an electric conductive state of the switch, check whether the interface IC outputs a fault generation signal based on the applied voltage, and diagnose the abnormality of the one or more main control units based on the fault generation signal.

In the exemplary embodiment, the main control unit may be configured to change a magnitude of the preset reference voltage so that overvoltage or low-voltage abnormality is diagnosed in the one or more batteries, and the auxiliary control unit may be configured to check whether a fault generation signal is output from the one or more battery management modules based on the changed preset reference voltage, and diagnose the abnormality of the one or more main control units based on the fault generation signal.

In the exemplary embodiment, the auxiliary control unit may be configured to transmit the fault generation signal output from the one or more battery management modules to the one or more main control units, and when the one or more main control units receives the fault generation signal, the one or more main control units may be configured to reset the magnitude of the changed reference voltage to an initially set value.

In the exemplary embodiment, the one or more main control units, the auxiliary control unit, the interface IC, and the one or more battery management modules may be connected by a daisy chain connection scheme.

Another exemplary embodiment of the present invention provides a method of diagnosing an abnormality of one or more main control units, the method including: controlling, by one or more main control units, one or more battery management modules, which are connected to one or more batteries, respectively; diagnosing, by an auxiliary control unit, the abnormality of the one or more main control units through near field communication; and performing, by an interface IC, communication between the one or more main control units, the auxiliary control unit, and the one or more battery management modules, in which diagnosing the abnormality of the one or more main control units includes, when the one or more main control units are in a normal state, setting a reference voltage preset in the one or more main control units to a comparison value of the interface IC, comparing the voltage applied to the interface IC with the set comparison value, and diagnosing abnormality of the interface IC.

In the exemplary embodiment, the auxiliary control unit may communicate with the one or more main control units by using a universal asynchronous receiver-transmitter (UART) communication scheme.

In the exemplary embodiment, the method may further include: outputting, by a voltage source, a voltage exceeding each of the preset reference voltage and the set comparison value; and switchably connecting and disconnecting, by a switch, the voltage source and the interface IC.

In the exemplary embodiment, diagnosing the abnormality of the one or more main control units may include applying the voltage output from the voltage source to the interface IC by controlling an electric conductive state of the switch, checking whether the interface IC outputs a fault generation signal based on the applied voltage, and diagnosing the abnormality of the one or more main control units based on the output of the fault generation signal.

In the exemplary embodiment, controlling the one or more battery management modules may include changing a magnitude of the preset reference voltage so that an overvoltage abnormality or a low-voltage abnormality is diagnosed in the one or more batteries, and diagnosing the abnormality of the one or more main control units may further include checking whether a fault generation signal is output from the one or more battery management modules based on the changed preset reference voltage, and diagnosing the abnormality of the one or more main control units based on the fault generation signal.

In the exemplary embodiment, diagnosing the abnormality of the one or more main control units may further include: transmitting the fault generation signal output from the one or more battery management modules to the one or more main control units; and when the one or more main control units receive the fault generation signal, resetting the magnitude of the changed reference voltage to an initially set value.

In the exemplary embodiment, the one or more main control units, the auxiliary control unit, the interface IC, and the one or more battery management modules may be connected by a daisy chain connection scheme.

Advantageous Effects

The present invention has an advantage in that it is possible to provide a main control unit satisfying the Automotive Safety Integrity Level (ASIL), which is capable of controlling a battery monitoring system having a level of the ASIL D, by additionally providing an auxiliary control unit, in addition to the main control unit for controlling the battery monitoring system included in a battery management system, and diagnosing abnormality of the main control unit based on signals output from the battery management module and the main control unit.

Further, the present invention has an advantage in that it is possible to prevent a problem generated during a signal transception process between the main control unit and the battery management module by setting a reference voltage preset by the main control unit as a comparison value of an interface IC when the main control unit is in a normal state, comparing a voltage applied to the interface IC with the comparison value, and diagnosing abnormality of the interface IC.

DETAILED DESCRIPTION

Hereinafter, an exemplary embodiment is presented for helping understanding of the present invention. However, the exemplary embodiment below is simply provided for easier understanding of the present invention, and the contents of the present invention are not limited by the exemplary embodiment.

The term "unit" as used in the specification (e g , main control unit, control unit, auxiliary control unit, switch unit) refers to a unit that processes at least one function or operation. The unit may be implemented by hardware (e.g., one or more switches, one or more processors), software (e.g., one or more applications, one or more programs) or a combination thereof.

Figure 1:
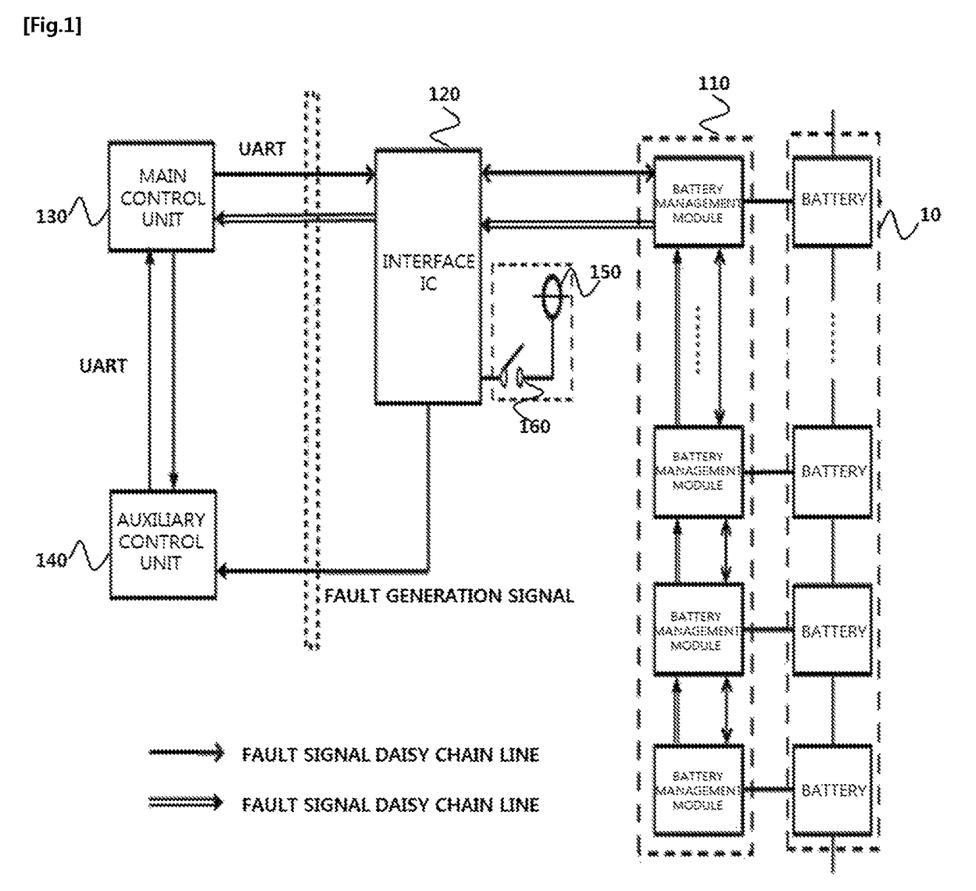
FIG. 1 is a diagram schematically illustrating a system 100 for diagnosing abnormality of a main control unit according to an exemplary embodiment of the present invention.

FIG. 1 is a diagram schematically illustrating a system 100 for diagnosing abnormality of a main control unit according to an exemplary embodiment of the present invention.

Referring to FIG. 1, a system 100 for diagnosing abnormality of a main control unit according to an exemplary embodiment of the present invention may include a battery management module 110, an interface IC 120, a main control unit 130, and an auxiliary control unit 140.

Herein, the system 100 for diagnosing abnormality of a main control unit illustrated in FIG. 1 is based on the exemplary embodiment, and constituent elements thereof are not limited to the exemplary embodiment illustrated in FIG. 1, and may be added, changed, or deleted as necessary. For example, in another exemplary embodiment, one battery management module 110 may manage a plurality of batteries 10.

First, one or more battery management modules 110 may be connected with one or more batteries 10, respectively, and may monitor and diagnose a state of one or more batteries 10. For example, one or more battery management modules 110 may acquire information about any one or more of a temperature, a current, a voltage, a state of charge (SoC), and state of health (SoH) from one or more connected batteries 10.

Further, one or more battery management modules 110 may diagnose a state of one or more batteries 10 based on the information acquired from one or more batteries 10. For example, when a reference voltage preset for diagnosing an overvoltage of a battery is 4.5 V and a voltage value acquired from the battery 10 is 5.0 V, one or more battery management modules 110 may diagnose that overvoltage abnormality is generated in the corresponding battery 10.

In the exemplary embodiment, when abnormality is generated in one or more batteries 10, one or more battery management modules 110 may output a fault generation signal.

Herein, the fault generation signal may mean a signal output by the battery management module 110 connected with the battery 10, in which a fault is generated, when abnormality and a fault are generated in one or more batteries 10. For example, when it is diagnosed that a voltage of the battery 10 is in an overvoltage state as a result of the measurement of the voltage of the battery 10 by the battery management module 110 based on a size of the reference voltage set by the main control unit 130, which is to be described below, the battery management module 110 may output a fault signal. In this case, the fault generation signal may be an error signal.

The interface IC 120 may perform communication between one or more battery management modules 110 and one or more main control units 130 and the auxiliary control unit 140, which are to be described below. For example, the interface IC 120 may perform the communication between one or more battery management modules 110 and one or more main control units 130, and transmit one or more pieces of information about the battery 10 acquired from one or more battery management modules 110 and information about whether abnormality is generated in the battery 10 to the main control unit 130, which is to be described below. Further, the interface IC 120 may receive a control signal output from the main control unit 130, which is to be described below, and transmit the received control signal to one or more battery management modules 110. To this end, the interface IC 120 may include a communication block and a sensing block.

In the exemplary embodiment, the interface IC 120 may set a comparison value.

Herein, the comparison value may be a voltage value serving as a reference set for diagnosing whether a state of a voltage applied to the interface IC 120 is in an overvoltage state or a low-voltage state, and may mean a value serving as a reference set for diagnosing abnormality of the interface IC 120. For example, a comparison value for diagnosing abnormality of the interface IC 120 by the auxiliary control unit 140, which is to be described below, may be described as 4.5 V, and when a voltage exceeding 4.5 V is applied to the interface IC 120, the interface IC 120 may output a fault generation signal. Then, the auxiliary control unit 140, which is to be described below, may diagnose abnormality of the interface IC 120 based on the fault generation signal output from the interface IC 120.

The main control unit 130 may control one or more battery management modules 110, which are connected with one or more batteries 10, respectively. For example, the main control unit 130 may output a control signal for controlling a switching operation of one or more battery management modules 110, and one or more battery management modules 110 receiving the control signal may perform the switching operations based on the control signal.

Further, the main control unit 130 may select an operation performed by one or more battery management modules 110, and output a control signal so that one or more battery management modules 110 perform the selected operation. For example, the main control unit 130 may select any one or more of an operation of blocking power output from the battery 10, an operation of measuring a temperature of the battery 10, an operation of measuring a voltage of the battery 10, and an operation of diagnosing abnormality of the battery 10, and control the selected operation to be initiated.

In the exemplary embodiment, the main control unit 130 may control each of one or more systems included in the battery management system, and to this end, the main control unit 130 may consist of one or more main control units 130. For example, the main control unit 130 may include a plurality of main control units 130 for controlling a battery monitoring system, a battery separating system, a communication system, a battery balancing system, and a battery protecting system, respectively.

In the exemplary embodiment, the main control unit 130 may set a reference voltage.

Herein, the reference voltage may mean a voltage value serving as a reference set for diagnosing, by the main control unit 130, overvoltage or low-voltage abnormality of one or more batteries 10. For example, the main control unit 130 may set a size of the reference voltage for diagnosing overvoltage abnormality to 4.5 V, and set a size of the reference voltage for diagnosing low-voltage abnormality to 2.0 V. Then, when a size of the voltage measured from one or more batteries 10 exceeds 4.5 V or less than 2.0 V, the main control unit 130 may compare the size of the measured voltage with the size of the reference voltage and diagnose a state of the battery 10 as an overvoltage or low-voltage state.

The auxiliary control unit 140 may communicate with the main control unit 130 through near field communication. For example, the auxiliary control unit 140 may communicate with the main control unit 130 by using a universal asynchronous receiver-transmitter (UART) communication scheme.

In the exemplary embodiment, the main control unit 130, the auxiliary control unit 140, the interface IC 120, and one or more battery management modules 110 may be connected by a daisy chain connection scheme. For example, the main control unit 130, the auxiliary control unit 140, the interface IC 120, and one or more battery management modules 110 may be connected through a communication daisy chain line for transceiving a control signal and information therebetween and a fault signal daisy chain line for transceiving a fault generation signal as illustrated in FIG. 1.

The auxiliary control unit 140 may diagnose abnormality of the main control unit 130.

In the exemplary embodiment, the main control unit 130 may change the size of the preset reference voltage so that overvoltage or low-voltage abnormality is diagnosed in one or more batteries 10, and the auxiliary control unit 140 may check whether the fault generation signal is output from one or more battery management modules 110 based on the changed reference voltage and diagnose abnormality of the main control unit 130 based on the output of the fault generation signal.

For example, when the overvoltage reference voltage and the low-voltage reference voltage, which are initially set, of the battery 10 are 4.5 V and 2.0 V, respectively, the main control unit 130 may change the preset reference voltages to 3.5 V and 3.0 V, which are the voltage in the normal state of the battery 10. The reference voltage changed by the main control unit 130 is transferred to one or more battery management modules 110, and one or more battery management modules 110 may diagnose abnormality of one or more batteries 10 based on the changed reference voltage. In this case, the changed reference voltage is set to the voltage in the normal state of the battery 10, so that abnormality is detected in all of the batteries 10 and the battery management module 110 outputs the fault generation signal. Then, when the fault generation signal is output from one or more battery management modules 110, the auxiliary control unit 140 may diagnose that the main control unit 130 is in a normal state, and transmit the fault generation signal received from one or more battery management modules 110 to the main control unit 130.

In the exemplary embodiment, when the fault generation signal is received from the auxiliary control unit 140, the main control unit 130 may re-set the size of the changed reference voltage to the size of the initially set reference voltage.

In the exemplary embodiment, when abnormality is generated in the main control unit 130, the auxiliary control unit 140 may transmit an abnormality generation signal to the main control unit 130.

Herein, the abnormality generation signal may mean a signal for notifying that abnormality is generated in the main control unit 130. For example, the abnormality generation signal may be a signal including information on the type of abnormal operation generated in the main control unit 130, a generation time of the abnormal operation, and the like, and an inspection requesting signal requesting an inspection of the main control unit 130.

In the exemplary embodiment, the auxiliary control unit 140 receives a response signal from the main control unit 130 as a response to the abnormality generation signal transmitted to the main control unit 130, and when the auxiliary control unit 140 fails to receive the response signal, the auxiliary control unit 140 may stop the operation of the main control unit 130. For example, when the state of the battery 10 is diagnosed by changing the size of the reference voltage, but all of the batteries are diagnosed to be normal and the fault generation signal is not output, the auxiliary control unit 140 may diagnose that abnormality is generated in the main control unit 130. In this case, the auxiliary control unit 140 may transmit the abnormality generation signal to the main control unit 130, and the main control unit 130 receiving the abnormality generation signal may inspect a fault through self-inspection or a separate fault detecting circuit. In this case, when it is determined that abnormality is not generated, the main control unit 130 may check truth of the abnormal operation generated in the main control unit 130 by transmitting a response signal indicating a normal state to the auxiliary control unit 140. However, when a fault is generated in the main control unit 130, so that it is impossible to check truth for the abnormal operation, and the auxiliary control unit 140 cannot transmit a response signal to the abnormal operation, the auxiliary control unit 140 determines that the main control unit 130 is in a fault state and stops the operation of the main control unit 130, thereby preventing secondary damage generable due to the fault main control unit 130.

In the exemplary embodiment, the auxiliary control unit 140 may make one or more batteries 10 and the main control unit 130 be short-circuited by controlling an operation of a switching unit (not illustrated), which changes an electric conductive state between one or more batteries 10 and the main control unit 130, thereby blocking power supplied to the main control unit 130 and stopping the operation of the main control unit 130.

In the exemplary embodiment, the auxiliary control unit 140 may apply a voltage to the interface IC 120, and diagnose abnormality of the interface IC 120 based on the applied voltage and the comparison value set in the interface IC 120. To this end, the system 100 for diagnosing abnormality of a main control unit according to the exemplary embodiment of the present invention may further include a voltage source 150 and a switch unit 160.

The voltage source 150 may output a voltage having a size exceeding the size of the reference voltage preset in the main control unit 130 and the comparison value set in the interface IC 120. For example, when the size of the reference voltage preset in the main control unit 130 and the comparison value set in the interface IC 120 are 4.5 V, the voltage source 150 may output the voltage of 4.6 V.

The switch unit 160 may connect or disconnect the voltage source 150 and the interface IC 120.

In the exemplary embodiment, when the auxiliary control unit 140 desires to diagnose abnormality of the interface IC 120, the auxiliary control unit 140 may control an electric conductive state of the switch unit 160 and apply a voltage output from the voltage source 150 to the interface IC 120.

For example, when the auxiliary control unit 140 controls the electric conductive state of the switch unit 160 and applies a voltage output from the voltage source 150 to the interface IC 120, a voltage of 4.6 V larger than the comparison value of 4.5 V set in the interface IC 120 may be applied to the interface IC 120. In this case, the interface IC 120 may compare the set comparison value with the applied voltage value, and when the received voltage value is larger than the set comparison value, the interface IC 120 may output the fault generation signal. The auxiliary control unit 140 may check whether the fault generation signal is output from the interface IC 120, and when the fault generation signal is output, the auxiliary control unit 140 may diagnose the state of the interface IC 120 as a normal state.

Herein, the voltage value applied to the interface IC 120 is always larger than the comparison value, so that when the interface IC 120 is in the normal state, the interface IC 120 always needs to output the fault generation signal. When the interface IC 120 does not output the fault generation signal, the auxiliary control unit 140 may diagnose that a fault is generated in the interface IC 120. Hereinafter, a method of diagnosing abnormality of the main control unit according to an exemplary embodiment of the present invention will be described with reference to FIGS. 2 and 3.

Figure 2:
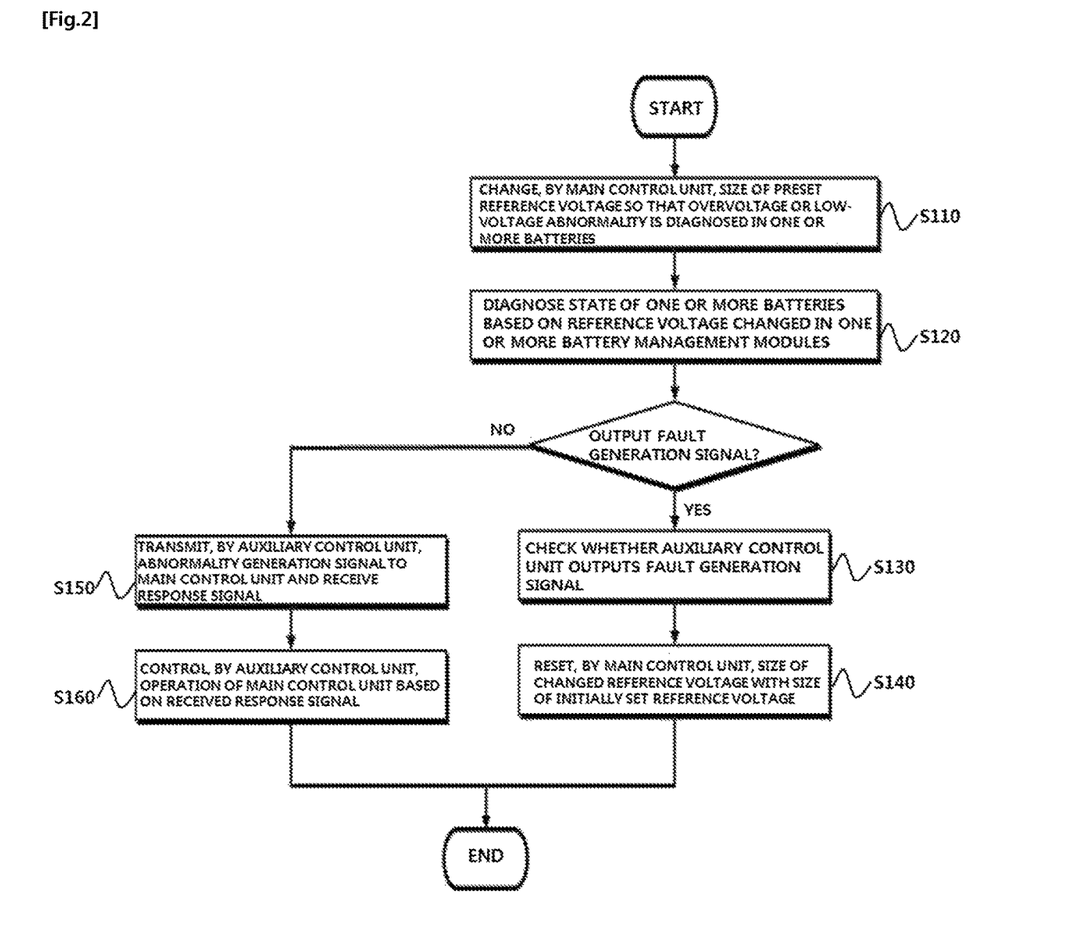
FIG. 2 is a flowchart for describing a series of processes of diagnosing abnormality of a main control unit 130 by using the system 100 for diagnosing abnormality of a main control unit according to an exemplary embodiment of the present invention.

FIG. 2 is a flowchart for describing a series of processes of diagnosing abnormality of the main control unit 130 by using the system 100 for diagnosing abnormality of a main control unit according to an exemplary embodiment of the present invention.

Referring to FIG. 2, the main control unit changes a size of a preset reference voltage so that overvoltage or low-voltage abnormality is diagnosed in one or more batteries (S110). One or more battery modules diagnose a state of one or more batteries based on the reference voltage changed in operation S110 (S120). When abnormality is generated in the one or more batteries in operation S120, the battery management module connected with the battery, in which abnormality is generated, outputs a fault generation signal, and the auxiliary control unit checks whether the one or more battery management modules output fault generation signals (S130). Herein, when the fault generation signal is output, the main control unit resets the size of the changed reference voltage to a size of an initially set reference voltage (S140).

When the one or more battery management modules do not output the fault generation signals, the auxiliary control unit transmits an abnormality generation signal to the main control unit and receives a response signal from the main control unit based on the transmitted abnormality generation signal (S150). When the auxiliary control unit fails to receive the response signal from the main control unit in operation S150, the auxiliary control unit stops an operation by controlling the operation of the main control unit (S160).

Figure 3:
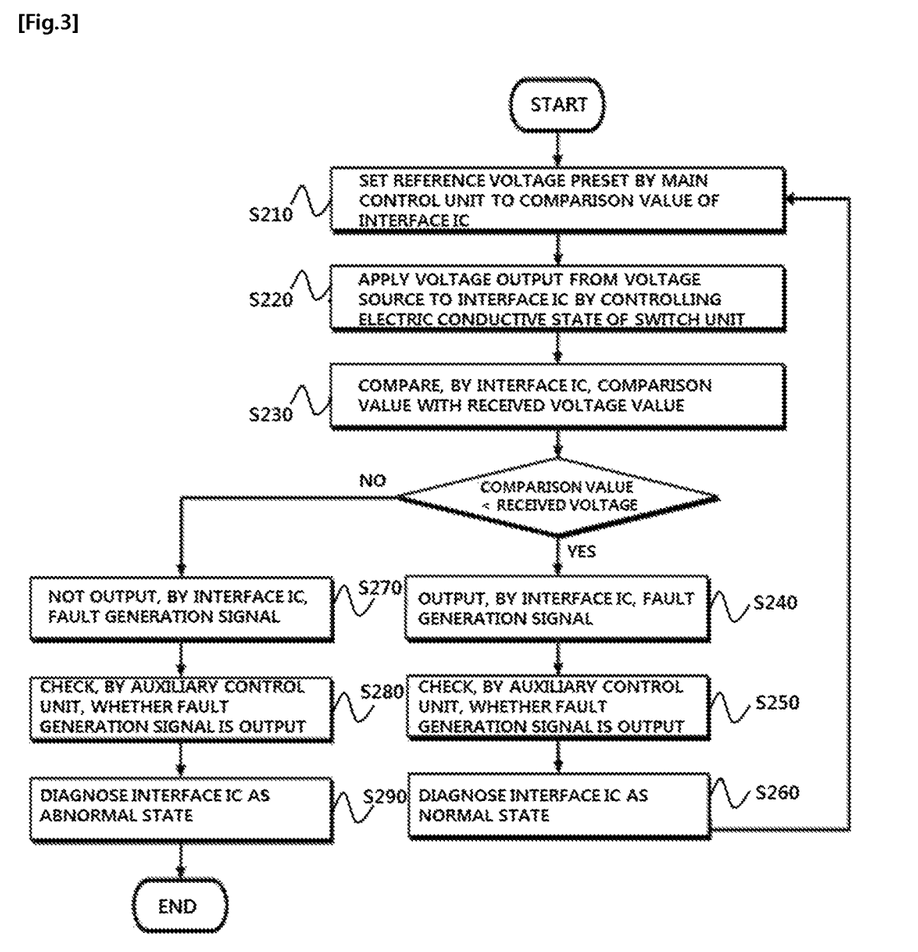
FIG. 3 is a flowchart for describing a series of processes of diagnosing abnormality of an interface IC 120 by using the system 100 for diagnosing abnormality of a main control unit according to an exemplary embodiment of the present invention.

FIG. 3 is a flowchart for describing a series of processes of diagnosing abnormality of the interface IC 120 by using the system 100 for diagnosing abnormality of a main control unit according to an exemplary embodiment of the present invention.

Referring to FIG. 3, first, when the main control unit is diagnosed as a normal state, a reference voltage preset by the main control unit is set to a comparison value of the interface IC (S210). The auxiliary control unit applies a voltage output from the voltage source to the interface IC by controlling an electric conductive state of the switch unit (S220), and the interface IC compares the set comparison value with a size of the applied voltage.

Herein, when the size of the received voltage is larger than the comparison value, the interface IC outputs a fault generation signal (S240). The auxiliary control unit checks whether the fault generation signal is output from the interface IC (S250), and when it is determined that the fault generation signal is output in operation S240, the auxiliary control unit diagnoses the interface IC as a normal state (S260). Then, the method returns to operation S210 and repeatedly performs operations S210 to S260.

When the size of the received voltage is not larger than the comparison value, the interface IC does not output the fault generation signal (S270). The auxiliary control unit checks whether the fault generation signal is output from the interface IC (S280) identically to operation S250, and when it is determined that the fault generation signal is not output in operation S270, the auxiliary control unit diagnoses the interface IC as an abnormal state (S290).

The method of diagnosing abnormality of the main control unit and the method of diagnosing abnormality of the interface IC by using the system 100 for diagnosing abnormality of the main control unit have been described with reference to the flowcharts presented in the drawings. For the simple description, the method is illustrated and described with the series of blocks, but the present invention is not limited to the order of the blocks, and some blocks may occur in the different order from the order illustrated and described in the present specification or may occur with other blocks at the same time, and various other branches, a flow path, and orders of the blocks achieving the same or similar result may be implemented. Further, for the implementation of the method described in the present specification, all of the illustrated blocks may not be required.

In the forgoing, the present invention has been described with reference to the exemplary embodiment of the present invention, but those skilled in the art may appreciate that the present invention may be variously corrected and changed within the range without departing from the spirit and the area of the present invention described in the appending claims.

The invention claimed is:

1. A system for diagnosing an abnormality of one or more main control units, the system comprising:
   the one or more main control units configured to control one or more battery management modules, which are connected to one or more batteries, respectively;
   an auxiliary control unit configured to diagnose the abnormality of the one or more main control units; and
   an interface integrated circuit (IC) configured to perform communication between the one or more main control units, the auxiliary control unit, and the one or more battery management modules,
   wherein when each of the one or more main control units is in a normal state, the auxiliary control unit is configured to:
      set a preset reference voltage of the one or more main control units to a comparison value of the interface IC;
      control application of a voltage to the interface IC, the voltage exceeding the preset reference voltage and the comparison value;
      check whether the interface IC outputs a fault generation signal based on the applied voltage; and
      diagnose an abnormality of the interface IC based on the fault generation signal.

2. The system of claim 1, wherein the auxiliary control unit is configured to communicate with the one or more main control units by using a universal asynchronous receiver-transmitter (UART) communication scheme.

3. The system of claim 1, further comprising:
   a voltage source configured to output the voltage exceeding each of the preset reference voltage and the set comparison value; and
   a switch configured to switchably connect and disconnect the voltage source and the interface IC.

4. The system of claim 3, wherein the auxiliary control unit is configured to:

apply the voltage output from the voltage source to the interface IC by controlling an electric conductive state of the switch.

5. The system of claim 1, wherein the main control unit is configured to change a magnitude of the preset reference voltage so that an overvoltage abnormality or a low-voltage abnormality is diagnosed in the one or more batteries, and the auxiliary control unit is configured to:
check whether a second fault generation signal is output from the one or more battery management modules based on the changed preset reference voltage; and
diagnose the abnormality of the one or more main control units based on the second fault generation signal.

6. The system of claim 5, wherein the auxiliary control unit is configured to transmit the second fault generation signal output from the one or more battery management modules to the one or more main control units, and
when the one or more main control units receive the second fault generation signal, the one or more main control units is configured to reset the magnitude of the changed reference voltage to an initially set value.

7. The system of claim 1, wherein the one or more main control units, the auxiliary control unit, the interface IC, and the one or more battery management modules are connected by a daisy chain connection scheme.

8. A method of for diagnosing an abnormality of one or more main control units, the method comprising:
controlling, by one or more main control units, one or more battery management modules, which are connected to one or more batteries, respectively;
diagnosing, by an auxiliary control unit, the abnormality of the one or more main control units; and
performing, by an interface IC, communication between the one or more main control units, the auxiliary control unit, and the one or more battery management modules,
wherein diagnosing the abnormality of the one or more main control units includes, when each of the one or more main control units is in a normal state, setting a present reference voltage of the one or more main control units to a comparison value of the interface IC, controlling application of a voltage exceeding the preset reference voltage and the comparison value to the interface IC, checking whether the interface IC outputs a fault generation signal based on the applied voltage, and diagnosing an abnormality of the interface IC based on the fault generation signal.

9. The method of claim 8, further comprising communicating, by the auxiliary control unit, with the one or more main control units by using a universal asynchronous receiver-transmitter (UART) communication scheme.

10. The method of claim 8, further comprising:
outputting, by a voltage source, a voltage exceeding each of the preset reference voltage and the set comparison value; and
switchably connecting and disconnecting, by a switch, the voltage source and the interface IC.

11. The method of claim 10, wherein diagnosing the abnormality of the one or more main control units includes:
applying the voltage output from the voltage source to the interface IC by controlling an electric conductive state of the switch.

12. The method of claim 8, wherein controlling the one or more battery management modules includes changing a magnitude of the preset reference voltage so that an overvoltage abnormality or a low-voltage abnormality is diagnosed in the one or more batteries, and
wherein diagnosing the abnormality of the one or more main control units further includes:
checking whether a second fault generation signal is output from the one or more battery management modules based on the changed preset reference voltage; and
diagnosing the abnormality of the one or more main control units based on the second fault generation signal.

13. The method of claim 12, wherein diagnosing the abnormality of the one or more main control units further includes:
transmitting the second fault generation signal output from the one or more battery management modules to the one or more main control units; and
when the one or more main control units receive the second fault generation signal, resetting the magnitude of the changed reference voltage to an initially set value.

14. The method of claim 8, wherein the one or more main control units, the auxiliary control unit, the interface IC, and the one or more battery management modules are connected by a daisy chain connection scheme.

* * * * *